United States Patent
Kawato et al.

(10) Patent No.: US 9,493,872 B2
(45) Date of Patent: Nov. 15, 2016

(54) VAPOR DEPOSITION APPARATUS AND METHOD FOR PRODUCING ORGANIC ELECTROLUMINESCENT ELEMENT

(71) Applicant: Sharp Kabushiki Kaisha, Osaka-shi (JP)

(72) Inventors: Shinichi Kawato, Osaka (JP); Satoshi Inoue, Osaka (JP); Takashi Ochi, Osaka (JP); Yuhki Kobayashi, Osaka (JP); Katsuhiro Kikuchi, Osaka (JP); Eiichi Matsumoto, Mitsuke (JP); Masahiro Ichihara, Mitsuke (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 14/910,642

(22) PCT Filed: Jul. 25, 2014

(86) PCT No.: PCT/JP2014/069657
§ 371 (c)(1),
(2) Date: Feb. 5, 2016

(87) PCT Pub. No.: WO2015/019866
PCT Pub. Date: Feb. 12, 2015

(65) Prior Publication Data
US 2016/0194747 A1 Jul. 7, 2016

(30) Foreign Application Priority Data
Aug. 7, 2013 (JP) ................................ 2013-164389

(51) Int. Cl.
*H01L 21/027* (2006.01)
*H01L 51/56* (2006.01)
(Continued)

(52) U.S. Cl.
CPC ............ *C23C 14/24* (2013.01); *C23C 14/042* (2013.01); *H01L 51/0011* (2013.01); *H01L 51/56* (2013.01); *H01L 51/5012* (2013.01)

(58) Field of Classification Search
CPC ...... C23C 14/24; C23C 14/042; H01L 51/56
USPC .......................................................... 438/46
See application file for complete search history.

(56) References Cited

U.S. PATENT DOCUMENTS

2010/0297349 A1 11/2010 Lee et al.
2011/0048320 A1 3/2011 Choi et al.
(Continued)

FOREIGN PATENT DOCUMENTS

JP 2010-270396 12/2010
JP 2011-52318 3/2011
(Continued)

OTHER PUBLICATIONS

International Search Report mailed Nov. 4, 2014, directed to International Application No. PCT/JP2014/069657, 2 pages.

*Primary Examiner* — Moazzam Hossain
*Assistant Examiner* — Omar Mojaddedi
(74) *Attorney, Agent, or Firm* — Morrison & Foerster LLP

(57) ABSTRACT

The present invention provides a vapor deposition apparatus capable of preventing abnormal film formation due to scattering in vapor deposition streams; and a method for producing an organic electroluminescent element which includes forming a patterned thin film with the vapor deposition apparatus. The present invention relates to a vapor deposition apparatus that includes a vapor deposition source equipped with a nozzle that ejects vapor deposition particles; an integrated limiting plate equipped with a first limiting plate including an opening that is in front of the nozzle, and with second limiting plates placed in the opening in the first limiting plate; and a mask including slits. The present invention also relates to a method for producing electroluminescent elements that includes a vapor deposition step of forming a patterned thin film with the vapor deposition apparatus.

10 Claims, 11 Drawing Sheets

(51) Int. Cl.
*C23C 14/24* (2006.01)
*C23C 14/04* (2006.01)
*H01L 51/00* (2006.01)
*H01L 51/50* (2006.01)

(56) References Cited

U.S. PATENT DOCUMENTS

| | | | |
|---|---|---|---|
| 2011/0220022 A1* | 9/2011 | Hong | C23C 14/042 118/663 |
| 2012/0183676 A1* | 7/2012 | Sonoda | C23C 14/042 427/8 |
| 2013/0017320 A1 | 1/2013 | Sonoda et al. | |
| 2014/0014920 A1* | 1/2014 | Lee | H01L 27/326 257/40 |
| 2014/0014924 A1* | 1/2014 | Oh | H01L 51/56 257/40 |
| 2014/0193581 A1 | 7/2014 | Choi et al. | |

FOREIGN PATENT DOCUMENTS

| | | |
|---|---|---|
| WO | WO-2011/034011 | 3/2011 |
| WO | WO-2011/129043 | 10/2011 |

* cited by examiner

VAPOR DEPOSITION APPARATUS AND METHOD FOR PRODUCING ORGANIC ELECTROLUMINESCENT ELEMENT

CROSS-REFERENCE TO RELATED APPLICATIONS

This application is a national phase application under 35 U.S.C. 371 of International Application No. PCT/JP2014/069657, filed Jul. 25, 2014, and which claims priority to Japanese Application No. 2013-164389, filed Aug. 7, 2013, the contents of which are incorporated herein by reference in their entirety.

FIELD OF THE INVENTION

The present invention relates to a vapor deposition apparatus and a method for producing an organic electroluminescent element. The present invention more specifically relates to a vapor deposition apparatus provided with a limiting plate that defines the paths of vapor deposition streams; and a method for producing an organic electroluminescent element which includes forming a patterned thin film with the vapor deposition apparatus.

BACKGROUND OF THE INVENTION

Vapor deposition apparatuses are configured to form a thin film by heating a substance such as a metal or a nonmetal in vacuum to evaporate or sublimate the substance, and condensing the vapor on a substrate. The apparatuses are used in various fields.

For example, an organic electroluminescent (EL) display device providing full color display typically includes organic EL light-emitting layers in three colors of red (R), green (G), and blue (B), and displays images by selectively emitting light using the layers with the desired luminance values. The patterns of the organic EL light-emitting layers are transferred by, for example, a vapor deposition apparatus.

One method having been developed recently utilizes a vapor deposition mask smaller than the substrate to carry out vapor deposition while moving the substrate relative to the vapor deposition mask and the vapor deposition source, so that organic EL light-emitting layers are formed on the substrate that is larger than the vapor deposition mask (e.g. Patent Literatures 1 and 2).

PATENT LITERATURE

Patent Literature 1: WO 2011/034011
Patent Literature 2: JP 2010-270396 A

SUMMARY OF THE INVENTION

FIG. 23 is a schematic cross-sectional view illustrating a conventional vapor deposition apparatus employing scanning vapor deposition. The scanning vapor deposition is a method for forming a vapor deposition film on a substrate while moving (scanning) the substrate or the mask. FIG. 23 shows the case where a film-formation target substrate (hereinafter, also referred to simply as a substrate) 115 or a vapor deposition mask (hereinafter, also referred to simply as a mask) 114 is moved in the direction orthogonal to the paper surface. In scanning vacuum deposition, as illustrated for example in FIG. 23, a limiting plate 113, the mask 114, and the substrate 115 are placed in the stated order above nozzles 112 of a vapor deposition source 111. The positions of the components are adjusted such that the openings in the limiting plate 113 come to face the nozzles 112. The limiting plate 113 is provided to prevent vapor deposition particles ejected from the adjacent nozzles 112 from being mixed. The vapor deposition particles ejected from the nozzles 112 form vapor deposition streams (dotted lines in FIG. 23) and pass through the openings in the limiting plate 113 and the slits in the mask 114, adhering to the predetermined positions on the substrate 115. Adjusting the positions of the openings in the limiting plate 113 and the positions of the slits in the mask 114 enables formation of a vapor deposition film 116 at a proper position.

Vapor deposition streams usually travel linearly. However, scattering may occur in vapor deposition streams as illustrated in FIG. 23. The present inventors have studied the phenomenon, and have found that one of the factors causing scattering in vapor deposition streams is an increase in the vapor deposition density in spaces surrounded by the limiting plate 113. In particular, when the ejection rate is set high or the nozzles 112 are arranged at narrow intervals in order to carry out the process, the vapor deposition density tends to be high. A high vapor deposition density is more likely to cause collision of vapor deposition particles, causing scattering. The scattering in the vapor deposition streams, though it depends on the level, may produce vapor deposition stream components with a different traveling direction from the desired direction (hereinafter, also referred to as abnormal vapor deposition stream components). When these components pass through the slits in the mask 114, a microfilm 117 may be formed at a position other than the desired positions on the substrate 115 (hereinafter, this phenomenon is also referred to as abnormal film formation).

In the case of an organic EL display device, for example, such abnormal film formation may lead to mixture of light rays emitted from the light-emitting layers in colors of red (R), green (G), and blue (B) to cause abnormal light emission, thereby spoiling display qualities.

The present invention was made in view of such a state of the art, and aims to provide a vapor deposition apparatus capable of preventing abnormal film formation due to scattering in vapor deposition streams, and a method for producing an organic electroluminescent element which includes forming a patterned thin film with the vapor deposition apparatus.

One aspect of the present invention is a vapor deposition apparatus including: a vapor deposition source equipped with a nozzle that ejects vapor deposition particles; an integrated limiting plate equipped with a first limiting plate including an opening that is in front of the nozzle, and with second limiting plates placed in the opening in the first limiting plate; and a mask including slits.

Another aspect of the present invention is a method for producing an organic electroluminescent element, including a vapor deposition step of forming a patterned thin film with a vapor deposition apparatus that includes a vapor deposition source equipped with a nozzle that ejects vapor deposition particles; an integrated limiting plate equipped with a first limiting plate including an opening that is in front of the nozzle, and with second limiting plates placed in the opening in the first limiting plate; and a mask including slits.

The vapor deposition apparatus of the present invention can prevent generation of abnormal film formation due to scattering in vapor deposition streams. The method for producing an organic EL element of the present invention enables production of a high-definition organic EL element which involves little abnormal film formation.

DETAILED DESCRIPTION OF THE INVENTION

The present invention will be described in more detail below with reference to the drawings based on embodiments which, however, are not intended to limit the scope of the present invention.

Examples of devices producible using the vapor deposition apparatus of any of the following embodiments include those including organic EL elements, such as organic EL displays and organic EL lamps; and display devices including pixels. In particular, the vapor deposition apparatuses of the following embodiments are suitable for producing organic EL substrates and color filter substrates which require precise formation of pixels.

Figure 1:
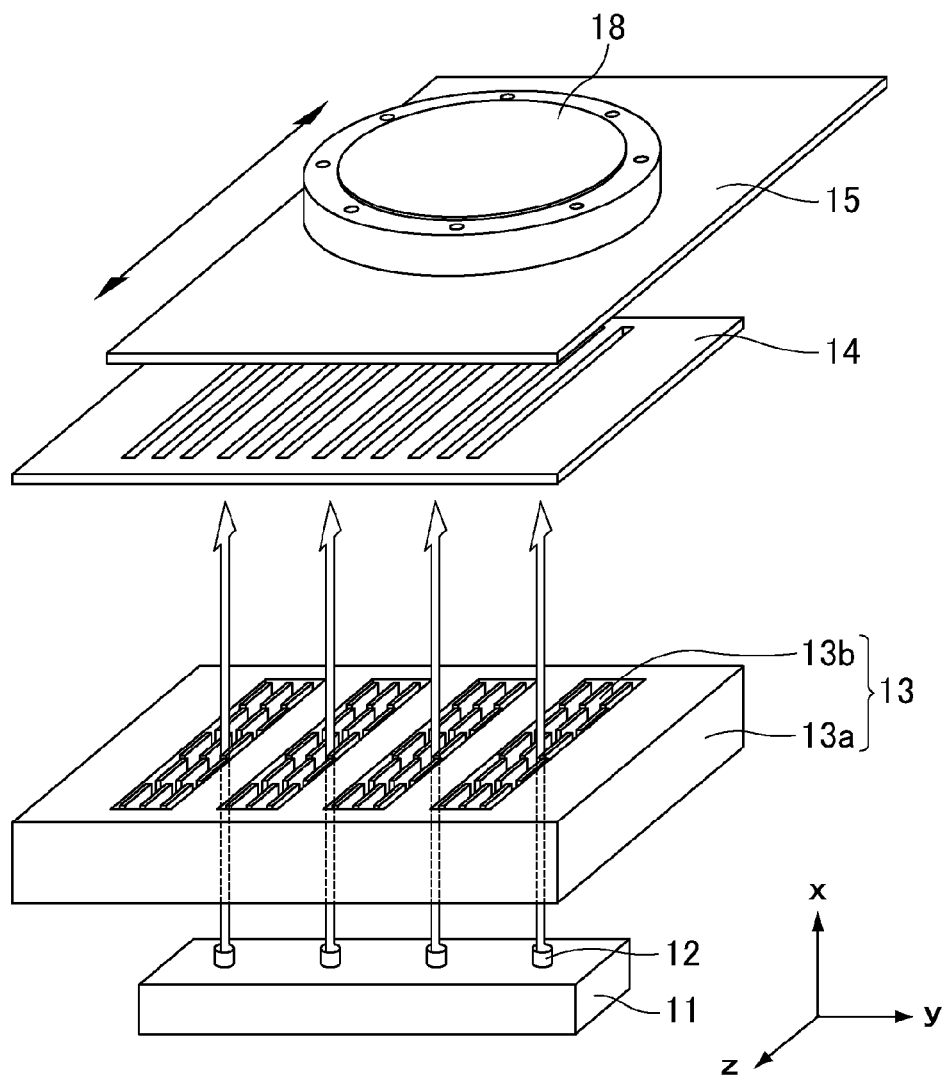
FIG. 1 is a schematic perspective view illustrating scanning vapor deposition on a film-formation target substrate with a vapor deposition apparatus of Embodiment 1.

FIG. 1 is a schematic perspective view illustrating scanning vapor deposition on a film-formation target substrate with a vapor deposition apparatus of Embodiment 1. As illustrated in FIG. 1, the vapor deposition apparatus of Embodiment 1 is provided inside with a vapor deposition source 11, an integrated limiting plate 13, and a mask 14 in the stated order toward a substrate 15. The substrate 15 is fixed by an electrostatic chuck (substrate holder) 18, and is slidable in the XYZ axis directions.

Between the vapor deposition source 11 and the integrated limiting plate 13 and between the integrated limiting plate 13 and the mask 14, a space is provided. The mask 14 includes slits, and the integrated limiting plate 13 includes openings. The longitudinal directions of the slits in the mask 14 and the longitudinal directions of the openings in the integrated limiting plate 13 are the same.

The vapor deposition source 11 is provided with nozzles 12 periodically formed in the right-left direction. The nozzles 12 individually eject vapor deposition particles toward the openings in the integrated limiting plate 13. The vapor deposition particles forming vapor deposition streams (single-headed arrows in FIG. 1) pass through the openings in the integrated limiting plate 13 and the slits in the mask 14, thereby reaching the substrate 15.

In the case of producing organic EL elements, organic materials and inorganic materials can be used as vapor deposition particles according to the applications. Organic materials can be used for light-emitting layers, hole injection layers, hole transport layers, electron injection layers, and electron transport layers, for example. Inorganic materials can be used for anodes and cathodes, for example.

In the example illustrated in FIG. 1, the substrate 15 is scanned in the same direction (double-headed arrow illustrated in FIG. 1) as the longitudinal direction of the slits in the mask 14, i.e., the Y-axis direction, but the direction is not necessarily limited to this direction. In the example illustrated in FIG. 1, the vapor deposition source 11, the integrated limiting plate 13, and the mask 14 are fixed and the substrate 15 is moved, but the substrate 15 may be fixed and the vapor deposition source 11, the integrated limiting plate 13, and the mask 14 may be relatively moved. The movements of the vapor deposition source 11, the integrated limiting plate 13, and the mask 14 may be controlled integrally or separately. Some or all of these components are connected to the engine such as a motor, and their movements in the XYZ axis directions are controlled by a separately provided drive circuit. The control by the drive circuit is performed with reference to alignment marks, for example. The alignment marks are provided at the ends (four corners) of the substrate 15 and the ends (four corners) of the mask 14, for example.

The integrated limiting plate 13 consists of a first limiting plate 13a including openings, and small limiting plates (second limiting plates) 13b formed in each opening in the first limiting plate 13a. The first limiting plate 13a can prevent the vapor deposition streams ejected from the adjacent nozzles 12 from being mixed with each other. Also, the first limiting plate 13a roughly defines the directions in which the vapor deposition streams ejected from the nozzles 12 travel until they reach the mask 14. The small limiting plates 13b are partitions formed to control the vapor deposition streams more precisely, and each have a size smaller than each opening in the first limiting plate 13a.

The shape of each opening in the first limiting plate 13a is not particularly limited, and may be a cuboid, for example. The size of each opening in the first limiting plate 13a is appropriately changed to suit the design of the product. For example, in a view in the direction parallel to the upper surface or the lower surface of the first limiting plate 13a, i.e., in a cross-sectional view of the vapor deposition apparatus, each opening has a size of, for example, 10 to 100 mm in length (x direction in FIG. 1), 5 to 30 mm in width (y direction in FIG. 1), and 50 to 500 mm in depth (z direction in FIG. 1).

The integrated limiting plate 13 is preferably cooled (specifically, set to 20° C. to 80° C.) so that the vapor deposition substances adhering to the walls are prevented from re-evaporating.

Figure 2:
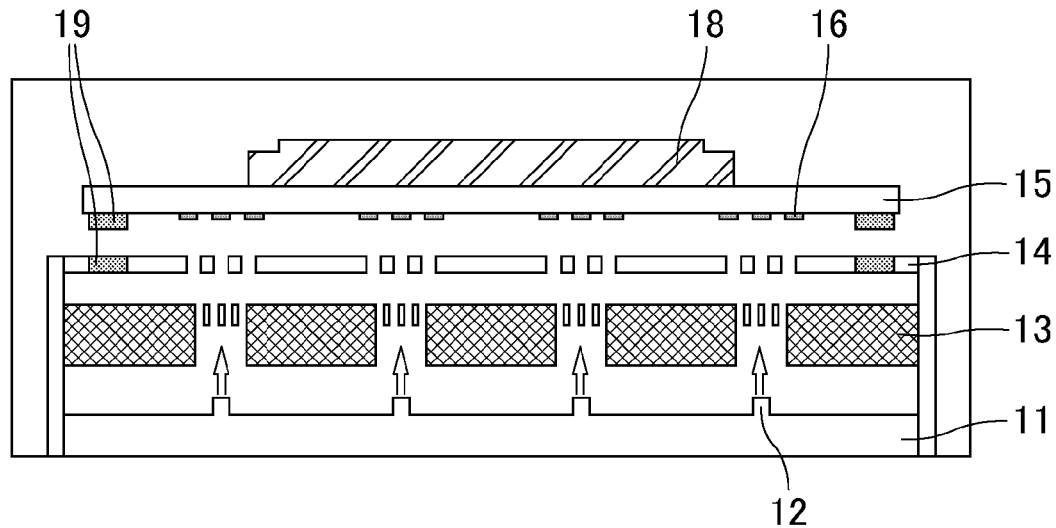
FIG. 2 is a schematic view illustrating one example of a scanning unit configured to control the movements of a vapor deposition source, an integrated limiting plate, a mask, and a substrate in the vapor deposition apparatus of Embodiment 1.

FIG. 2 is a schematic view illustrating one example of a scanning unit configured to control the movements of a vapor deposition source, an integrated limiting plate, a mask, and a substrate in the vapor deposition apparatus of Embodiment 1. In the example illustrated in FIG. 2, the vapor deposition source 11, the integrated limiting plate 13, and the mask 14 are combined at the ends, and thus can move integrally. The substrate 15 is fixed by the electrostatic chuck 18, and the movement thereof is controlled separately from the vapor deposition source 11, the integrated limiting plate 13, and the mask 14. The nozzles 12 are mounted onto the vapor deposition source 11. Simultaneously when the substrate 15 and the electrostatic chuck 18 are scanned or the vapor deposition source 11, the integrated limiting plate 13, and the mask 14 are scanned, vapor deposition particles are ejected from the nozzles 12 in the direction indicated by the arrows in the figure. At each end of the substrate 15 and the mask 14, an alignment mark 19 is provided to control the positions of the substrate 15 and the mask 14. By scanning vapor deposition controlled with the above scanning unit, a desired vapor deposition film 16 is formed.

As described above, the vapor deposition apparatus of Embodiment 1 may include (i) a substrate holder configured to fix a film-formation target substrate, and a scanning unit configured to fix the substrate holder and relatively moving the vapor deposition source, the integrated limiting plate, and the mask; or (ii) a substrate holder configured to fix a film-formation target substrate, and a scanning unit configured to fix the vapor deposition source, the integrated limiting plate, and the mask and moving the substrate holder.

Also, in the case of forming a film with the vapor deposition apparatus of Embodiment 1, the vapor deposition step may be (i) a step of forming a vapor deposition film on a film-formation target substrate while fixing a substrate holder holding the film-formation target substrate and relatively moving the vapor deposition source, the integrated limiting plate, and the mask; or (ii) a step of forming a vapor deposition film on a film-formation target substrate while fixing the vapor deposition source, the integrated limiting plate, and the mask and moving a substrate holder holding the film-formation target substrate.

Figure 3:
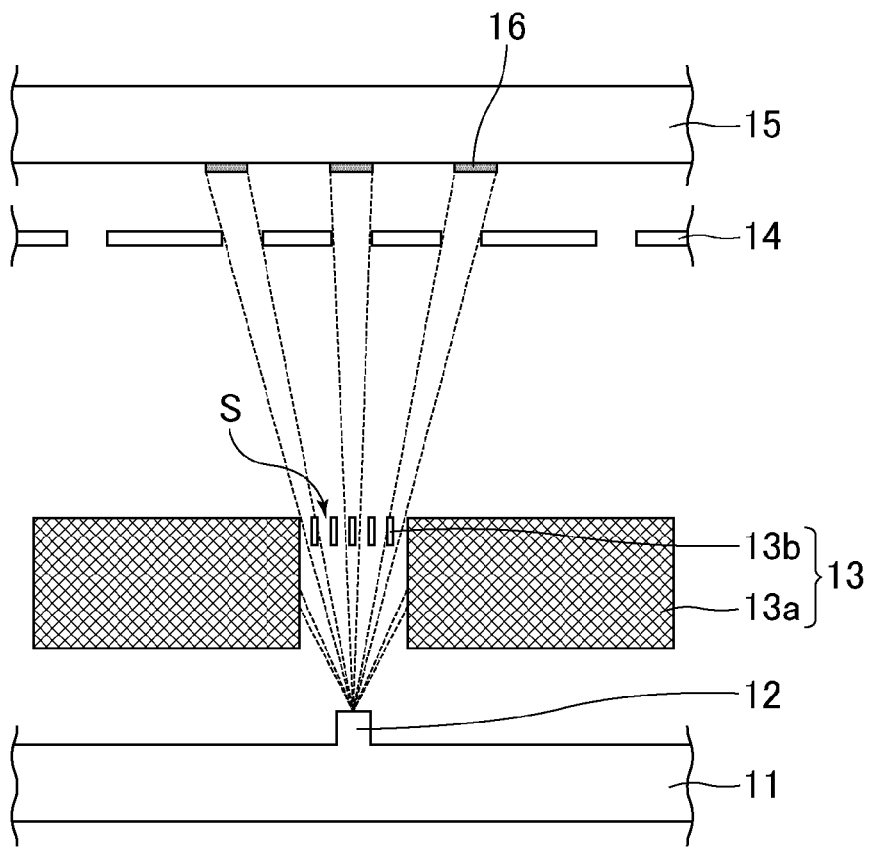
FIG. 3 is a schematic cross-sectional view of the vapor deposition apparatus of Embodiment 1.

FIG. 3 is a schematic cross-sectional view of the vapor deposition apparatus of Embodiment 1, and the dotted lines in FIG. 3 indicate the directions of the vapor deposition streams. Vapor deposition streams as a whole are ejected from the ejection orifices of the nozzles 12 to spread isotropically. Here, the substances at large radiation angles (angles from the direction of the ejection orifice of the nozzle 12) are blocked (filtered out) by the first limiting plate 13a, so that the substances are limited to those at small radiation angles. The vapor deposition apparatus in Embodiment 1 limits the vapor deposition streams also with the small limiting plates 13b formed in the vicinity of the outlet of each opening in the first limiting plate 13a. Hence, the substances limited by the first limiting plate 13a are further limited to substances at even smaller radiation angles, and then discharged to the outside of the integrated limiting plate 13.

Even when the vapor deposition particles collide with each other and are scattered inside an opening in the first limiting plate 13a, such two-step limitation significantly decreases the possibility that abnormal vapor deposition streams pass through the slits in the mask 14 because the small limiting plates 13b block the substances at large scattering angles. Thereby, abnormal film formation can be suppressed, so that the vapor deposition film 16 can be formed at a proper position.

The size of each small limiting plate 13b can be appropriately changed to suit the design of the product. For example, in a view in the direction parallel to the upper surface or the lower surface of the first limiting plate 13a, i.e., in a cross-sectional view of the vapor deposition apparatus, the small limiting plates 13b may each have a size of 5 to 30 mm in length (x direction in FIG. 1), 0.5 to 2 mm in width (y direction in FIG. 1), and 10 to 50 mm in depth (z direction in FIG. 1).

The vapor deposition particles tend to collide with each other in an environment with a high vapor deposition density. Since the vapor deposition density is likely to increase in the openings in the first limiting plate 13a, the small limiting plates 13b are provided inside the openings in the first limiting plate 13a. Preferably, as illustrated in FIG. 3, the small limiting plates 13b are placed along an interface S between the outlet of the opening in the first limiting plate 13a and the outside. This structure allows formation of an even more uniform film than in the case where the small limiting plates 13b are placed closer to the inlet of the opening in the first limiting plate 13a, i.e., closer to the nozzle 12.

It is also advantageous to place the small limiting plates 13b inside, not outside, each opening in the first limiting plate 13a from the viewpoint of the design activity. This is because the overall design of the film-formation pattern is implemented relative to the design of the openings in the first limiting plate. If the small limiting plates are placed outside each opening, the overall design needs to be re-implemented. Embodiment 1 achieves the effect of suppressing generation of scattering without changing this basic design.

The small limiting plates 13b in Embodiment 1 are integrated with the first limiting plate 13a, which brings an advantage that separate cooling of the limiting plates is not necessary. Still, the small limiting plates 13b are preferably removable because a decrease in the precision due to accumulation of adhering substances, and a decrease in the vapor deposition efficiency due to clogging of the openings in the first limiting plate 13a can be eliminated.

FIG. 3 illustrates the positions of the small limiting plates in an opening in the first limiting plate in a cross-sectional view of the vapor deposition apparatus. This structure in a view in the direction perpendicular to the upper surface or the lower surface of the first limiting plate 13a, i.e., in a top view of the vapor deposition apparatus, is illustrated in each of FIGS. 4 to 6. That is, FIGS. 4 to 6 each are a schematic view of the integrated limiting plate in a top view of the vapor deposition apparatus of Embodiment 1.

Figure 4:
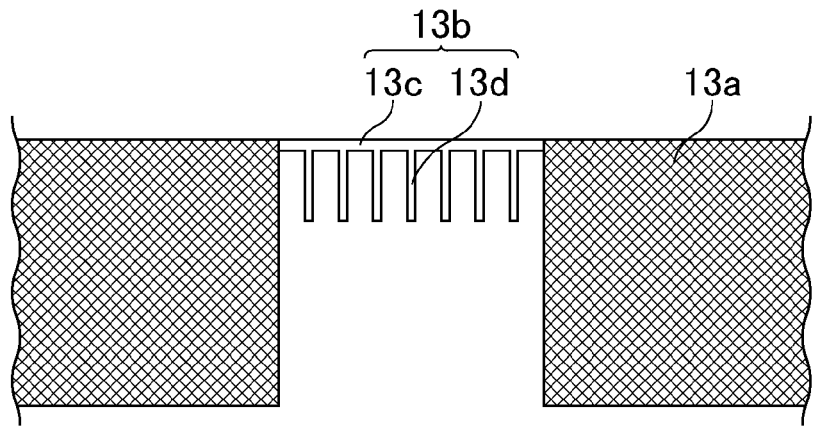
FIG. 4 is a schematic view illustrating one example of the integrated limiting plate in a top view of the vapor deposition apparatus of Embodiment 1.

In the example illustrated in FIG. 4, a supporter 13c of the small limiting plates 13b is in contact with the interface between the outlet of the opening in the first limiting plate 13a and the outside, and is positioned inside the opening in the first limiting plate 13a. From the supporter 13c, projections 13d extend toward the nozzle.

Figure 5:
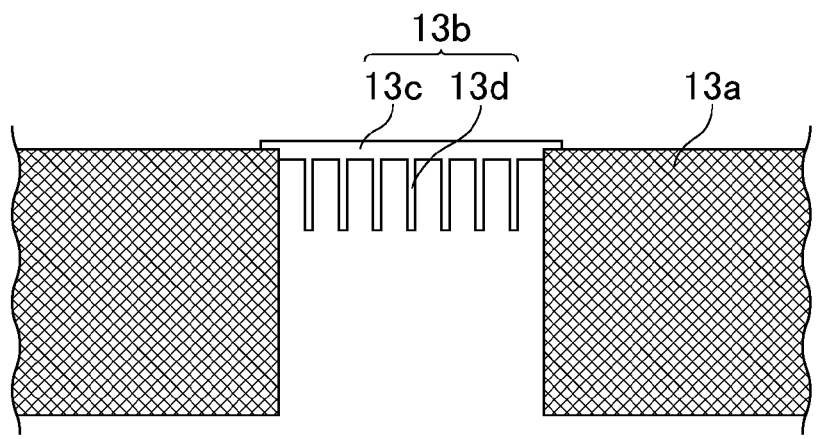
FIG. 5 is a schematic view illustrating another example of the integrated limiting plate in a top view of the vapor deposition apparatus of Embodiment 1.

In the example illustrated in FIG. 5, the supporter 13c of the small limiting plates 13b is in parallel with the interface between the outlet of the opening in the first limiting plate 13a and the outside, and is in both the inside and the outside of the opening in the first limiting plate 13a. From the supporter 13c, the projections 13d extend toward the nozzle.

Figure 6:
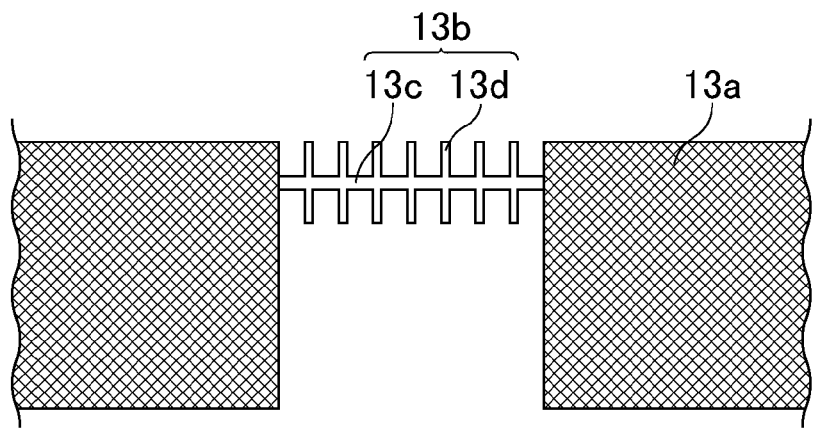
FIG. 6 is a schematic view illustrating yet another example of integrated limiting plate in a top view of the vapor deposition apparatus of Embodiment 1.

In the example illustrated in FIG. 6, the supporter 13c of the small limiting plates 13b is not in contact with the interface between the outlet of the opening in the first limiting plate 13a but is in parallel with the interface and in the inside of the opening in the first limiting plate 13a. From the supporter 13c, the projections 13d extend toward both the nozzle and the outside.

As described above, various shapes and arrangement positions can be employed for the small limiting plates. For example, as illustrated in FIGS. 4 to 6, the design of the small limiting plates 13b can be relatively easily implemented in the case where the supporters 13c of the first limiting plate 13a are placed in parallel with the interface between the outlets of the openings and the outside, and the direction of the projections 13d is orthogonal to the supporter 13c. However, the arrangement of the projections 13d of the first limiting plate 13a orthogonally to the supporters 13c, i.e., in parallel with the direction of the ejection orifice of the nozzle, causes the following problems.

Figure 7:
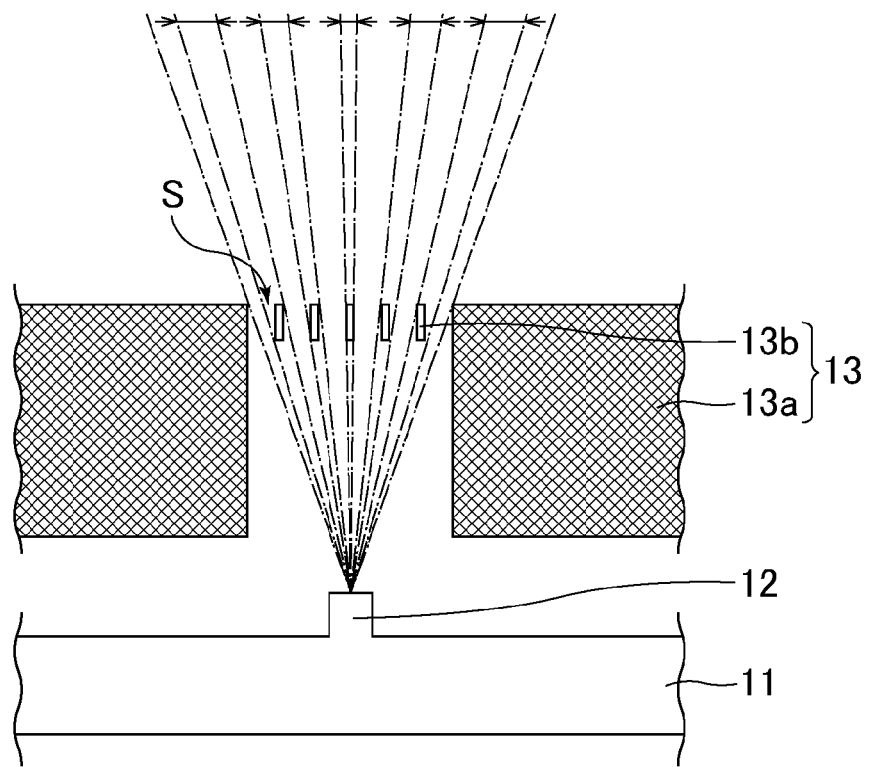
FIG. 7 is a schematic view of the vicinity of an opening in a first limiting plate in which small limiting plates are placed in parallel with the direction of an ejection orifice of a nozzle in Embodiment 1 and in the vicinity of the outlet of the opening in the first limiting plate.
Figure 8:
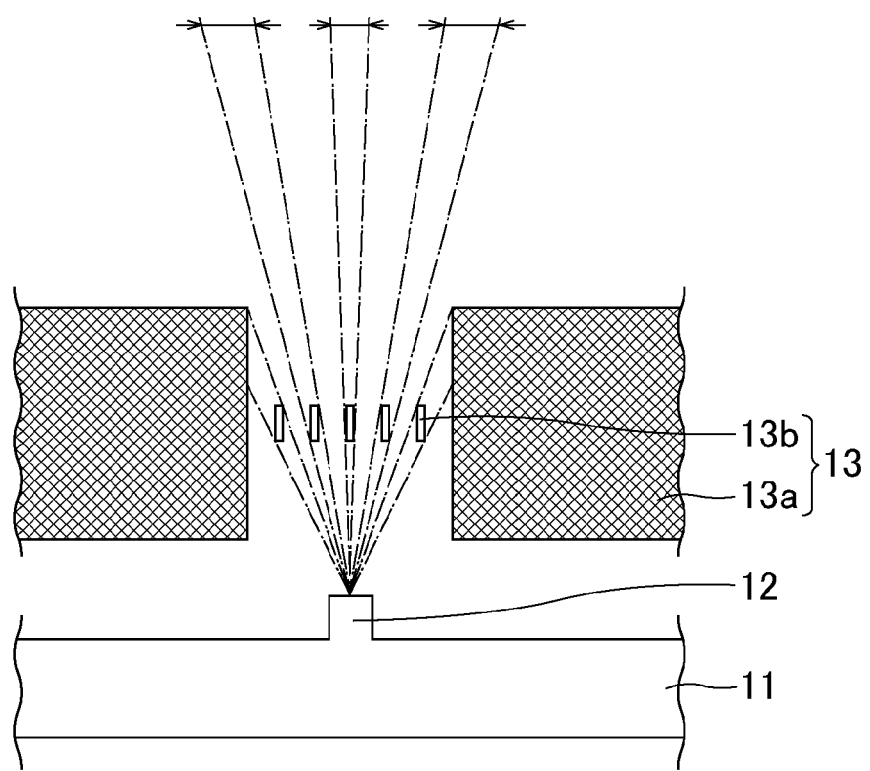
FIG. 8 is a schematic view of the vicinity of an opening in the first limiting plate in which the small limiting plates are placed in parallel with the direction of an ejection orifice of a nozzle in Embodiment 1 and in the vicinity of the center of the opening in the first limiting plate.

FIG. 7 and FIG. 8 each are a schematic view of the vicinity of an opening in a first limiting plate in which the small limiting plates are placed in parallel with the direction of an ejection orifice of a nozzle in Embodiment 1. FIG. 7 shows an arrangement in which the small limiting plates are placed in the vicinity of the outlet of the opening in the first limiting plate. FIG. 8 shows an arrangement in which the small limiting plates are placed in the vicinity of the center of the opening in the first limiting plate. The dashed lines in FIGS. 7 and 8 indicate the substances in the vapor deposition streams blocked by the small limiting plates.

Although the small limiting plates 13b are very effective in blocking abnormal vapor deposition streams, they unfortunately block some of the normal vapor deposition substances as well. The ranges indicated by the double-headed arrows in FIGS. 7 and 8 indicate the regions in each of which a film is not formed (hereinafter, also referred to as non-film-formation regions). This is an unavoidable problem in providing a limiting plate in a vapor deposition apparatus. When such blockage of normal vapor deposition substances occurs partly, a film may not be uniformly formed.

Still, the level of the influence changes depending on the positions of the small limiting plates. For example, as illustrated in FIG. 7, in the case where the small limiting plates 13b are placed in the vicinity of the outlet of each opening in the first limiting plate 13a, i.e., in the case where the small limiting plates 13b are placed side by side along the interface S between the outlet of the opening in the first limiting plate 13a and the outside, the small limiting plates 13b are placed as far away as possible from the nozzles 12. Accordingly, unevenness between the film-formation regions and the non-film-formation regions is not likely to occur.

Meanwhile, in the case where the small limiting plates 13b are placed in the vicinity of the center of the opening in the first limiting plate 13a as in the example illustrated in FIG. 8, the small limiting plates 13b are placed at positions closer to the nozzles 12. Hence, compared to the example illustrated in FIG. 7, the unevenness between the film-formation region and the non-film-formation region is more noticeable.

That is, the arrangement of the small limiting plates 13b illustrated in FIG. 7 allows formation of a uniform film compared to the arrangement of the small limiting plates 13b illustrated in FIG. 8.

Also, in comparison between the example illustrated in FIG. 7 and the example illustrated in FIG. 8, the example illustrated in FIG. 7 in which the small limiting plates 13b are placed closer to the substrate is more effective in terms of preventing the influence of scattering in vapor deposition streams.

Figure 9:
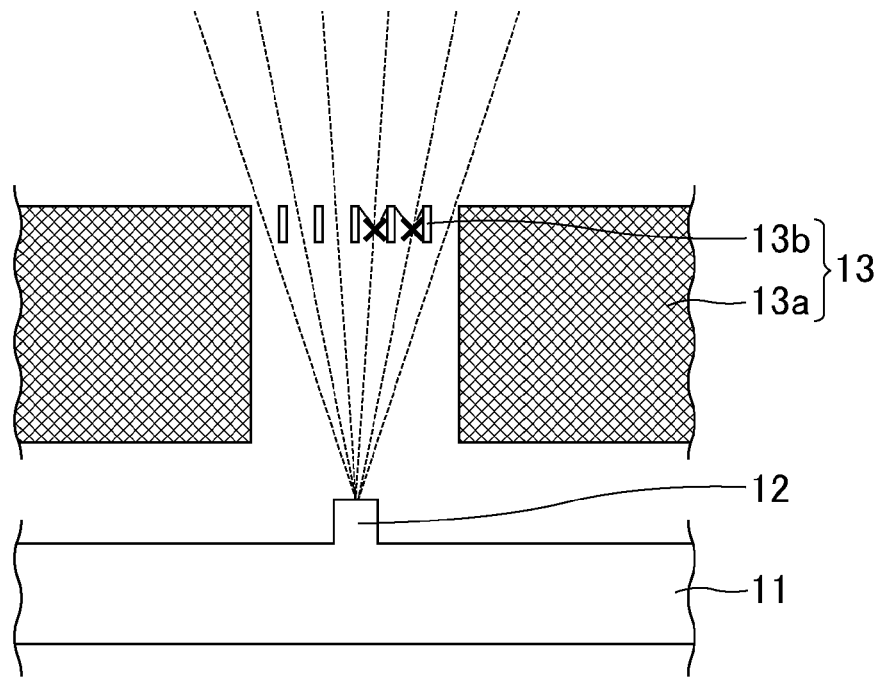
FIG. 9 is a schematic view of an opening in the first limiting plate in which the small limiting plates are placed in parallel with the direction of an ejection orifice of a nozzle and in the vicinity of the outlet of the opening in the first limiting plate.
Figure 10:
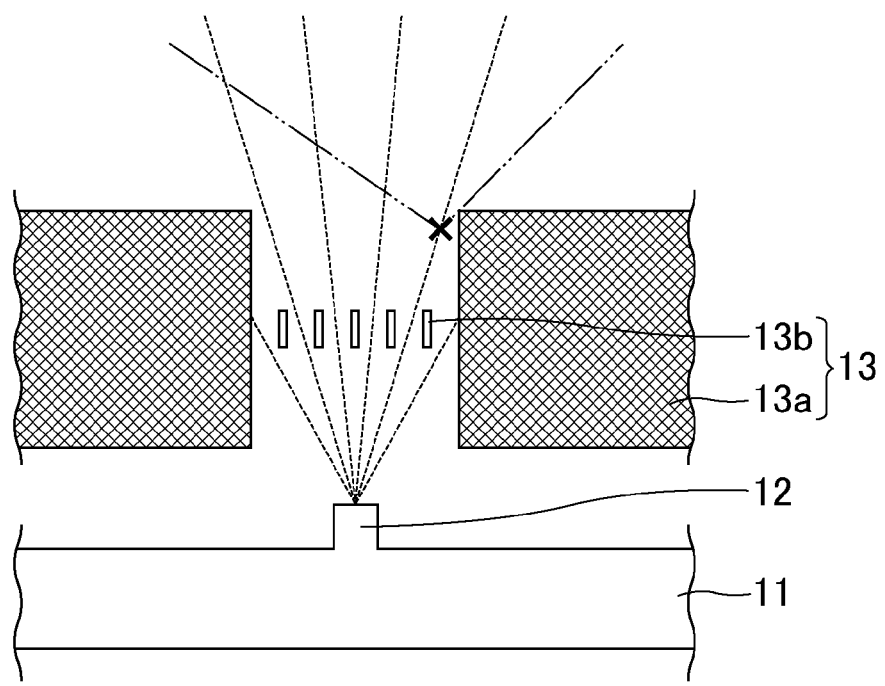
FIG. 10 is a schematic view of an opening in the first limiting plate in which the small limiting plates are placed in parallel with the direction of an ejection orifice of a nozzle and in the vicinity of the center of the opening in the first limiting plate.

FIG. 9 and FIG. 10 each are a schematic view of an opening in the first limiting plate in which the small limiting plates are placed in parallel with the direction of an ejection orifice of a nozzle. FIG. 9 shows an arrangement in which the small limiting plates are placed in the vicinity of the outlet of the opening in the first limiting plate. FIG. 10 shows an arrangement in which the small limiting plates are placed in the vicinity of the center of the opening in the first limiting plate. The dotted lines in FIG. 9 and FIG. 10 indicate the directions of the vapor deposition streams.

As is clear from comparison between FIG. 9 and FIG. 10, the example illustrated in FIG. 9 in which the small limiting plates are placed closer to the substrate achieves the blocking effect also on the vapor deposition streams in which scattering has occurred in the vicinity of the outlet of each opening in the first limiting plate.

As described above, in Embodiment 1, it is preferred that the small limiting plates (second limiting plates) are placed between the center of each opening in the first limiting plate and the outlet of the opening, and it is more preferred that the small limiting plates are placed side by side along the interface between the outlet of each opening in the first limiting plate and the outside. Thereby, the vapor deposition pattern can be transferred with an increased precision, which brings advantages such as achievement of high definition displays and an increase in the yield which increases the productivity.

Figure 11:
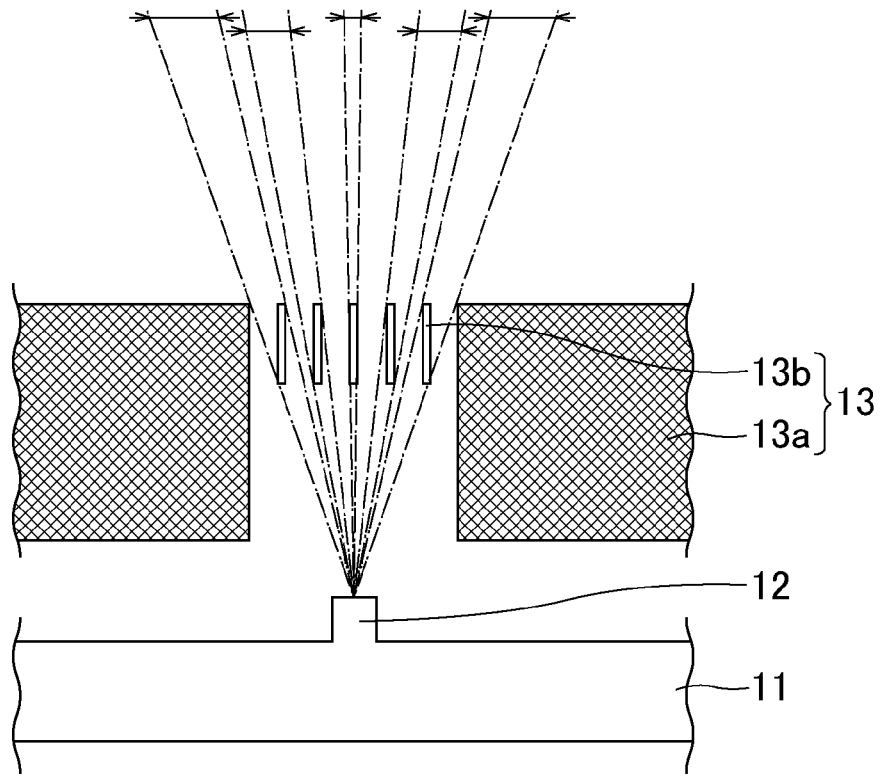
FIG. 11 is a schematic view illustrating the case where the small limiting plates are designed to be longer than in the case illustrated in FIG. 7.

FIG. 11 is a schematic view illustrating the case where the small limiting plates are designed to be longer than in the case illustrated in FIG. 7. The small limiting plates 13b can more suitably block abnormal vapor deposition substances due to scattering in vapor deposition streams as they are designed to be longer, but they are more likely to block normal vapor deposition substances if they are excessively long. The optimal length of the small limiting plates is 5 to 30 mm, though it depends on the desired design.

In order to solve the problem of no film formation, it is preferred that the arrangement of the small limiting plates in a top view of the vapor deposition apparatus is also devised.

Figure 12:
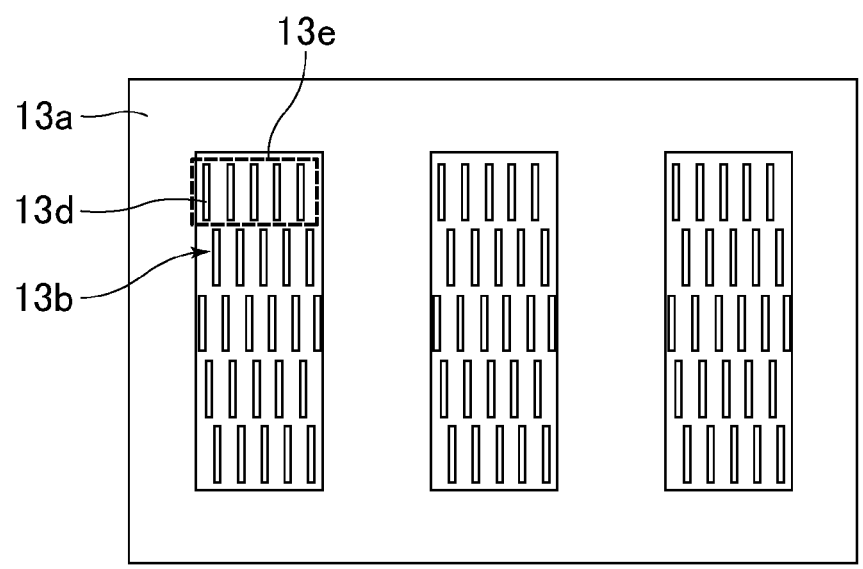
FIG. 12 is a conceptual view of an integrated limiting plate in a top view of the vapor deposition apparatus of Embodiment 1.

FIG. 12 is a conceptual view of an integrated limiting plate in a top view of the vapor deposition apparatus of Embodiment 1. As illustrated in FIG. 12, the small limiting plates 13b as a whole are arranged such that the projections 13d extending in the same direction as the longitudinal direction of the openings in the first limiting plate 13a are placed at certain intervals in the row direction. Also, the projections 13b are placed as groups in the substrate transport direction. More specifically, the small limiting plates 13b are divided into projection groups 13e each consisting of projections 13d placed in a line at certain intervals in the row direction, and the lines of the projection groups 13e are slightly shifted from each other in the row direction between adjacent lines.

Figure 13:
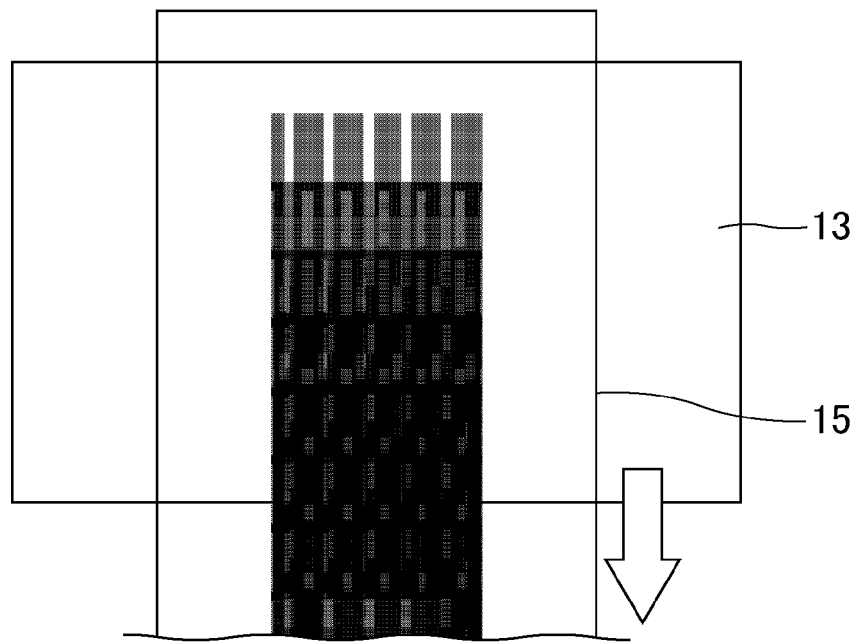
FIG. 13 is a schematic view illustrating how a film is formed on a film-formation target substrate by scanning with the vapor deposition apparatus of Embodiment 1 in a top view.

FIG. 13 is a schematic view illustrating how a film is formed on a film-formation target substrate by scanning with the vapor deposition apparatus of Embodiment 1 in a top view. FIG. 13 illustrates the case where the integrated limiting plate 13 and the mask are fixed and the substrate 15 is scanned from the top to the bottom (in the direction indicated by the arrow in the figure).

As illustrated in FIG. 13, the integrated limiting plate 13 in Embodiment 1 enables formation of a uniform vapor deposition film on the entire surface of the substrate 15 when all the rows are scanned.

In this manner, the integrated limiting plate in Embodiment 1 enables formation of a uniform film when scanning vapor deposition is performed by scanning the substrate or the mask, whereby the problem of generation of non-film-formation regions can be minimized.

The example illustrated in FIG. 12 shows the conceptual positions of the small limiting plates in Embodiment 1, and this concept can specifically take the following forms. FIG. 14 to FIG. 17 each are a schematic view of the integrated limiting plate in a top view of the vapor deposition apparatus of Embodiment 1.

Figure 14:
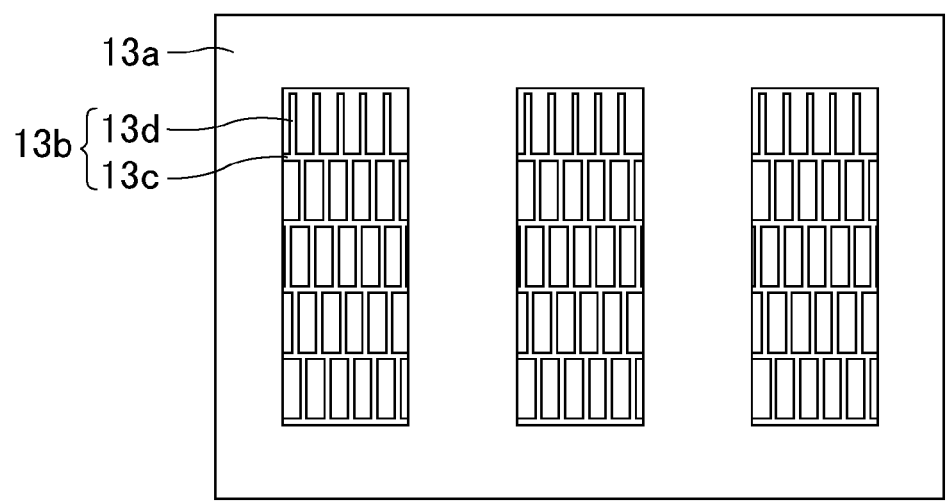
FIG. 14 is a schematic view illustrating one example of the integrated limiting plate in a top view of the vapor deposition apparatus of Embodiment 1.

In the example illustrated in FIG. 14, the small limiting plates 13b as a whole resemble a shape of a bookshelf. Specifically, the small limiting plates 13b consist of the supporters (beams) 13c and the projections (partitions) 13d alternately stacked from the bottom row to the top row.

Figure 15:
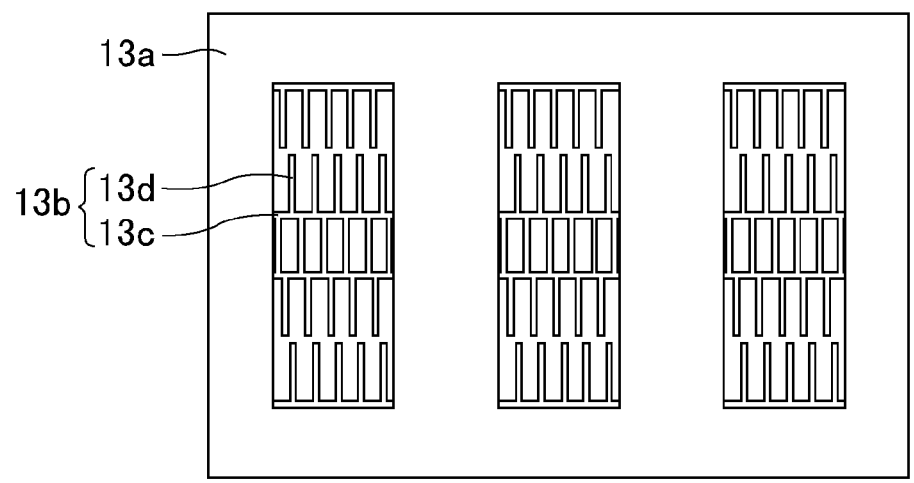
FIG. 15 is a schematic view illustrating another example of the integrated limiting plate in a top view of the vapor deposition apparatus of Embodiment 1.

In the example illustrated in FIG. 15, the small limiting plates 13b as a whole resemble a shape of a bookshelf. Specifically, the small limiting plates 13b consist of a ladder-like part positioned around the center of each opening in the first limiting plate 13a, the supporter 13c at the top row, the supporter 13c at the bottom row, and the projections 13d extending upwardly or downwardly from these parts.

Figure 16:
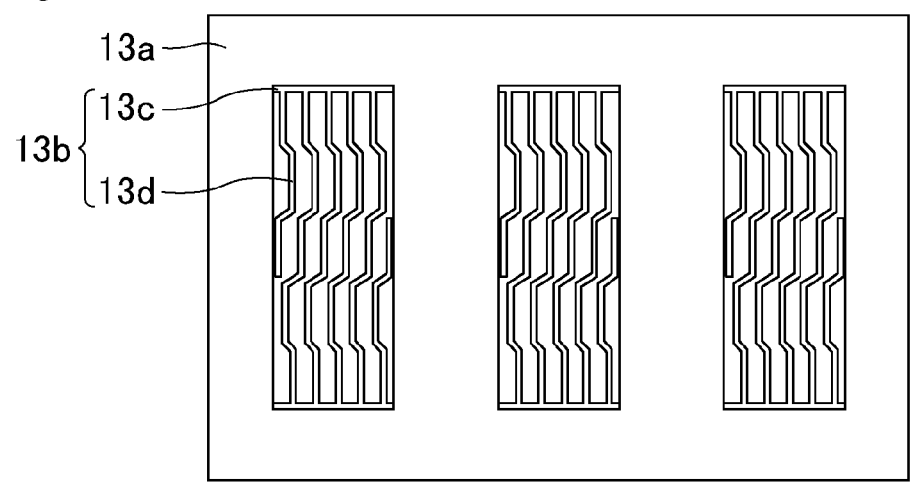
FIG. 16 is a schematic view illustrating yet another example of the integrated limiting plate in a top view of the vapor deposition apparatus of Embodiment 1.

In the example illustrated in FIG. 16, the small limiting plates 13b consist of the supporter 13c at the top row, the supporter 13c at the bottom row, and the zigzag projections 13d extend upwardly or downwardly from these supporters.

Figure 17:
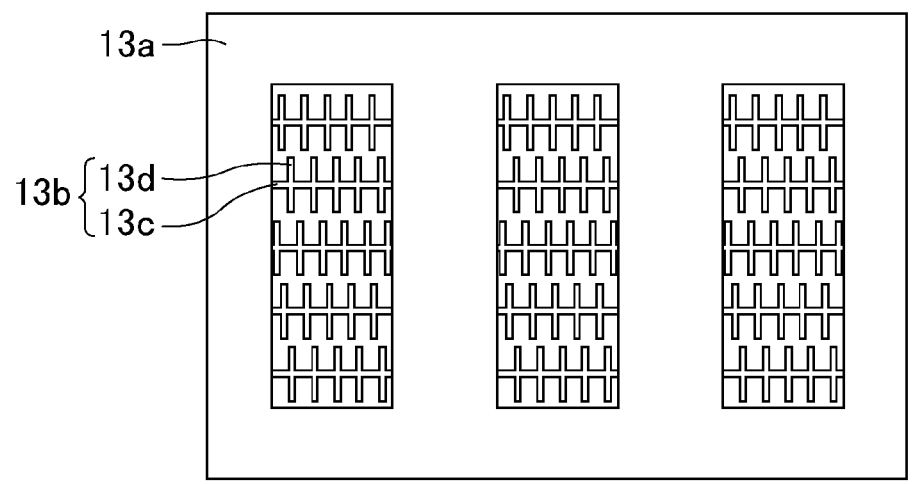
FIG. 17 is a schematic view illustrating yet another example of the integrated limiting plate in a top view of the vapor deposition apparatus of Embodiment 1.

In the example illustrated in FIG. 17, the small limiting plates 13b consist of units in each of which the projections 13d extend upwardly and downwardly from each side of each projection 13d.

FIGS. 13 to 17 each illustrate the state in which five units (five rows) of the projection groups occupy one opening, but the number of rows of the projection groups in Embodiment 1 is not particularly limited. For example, units of the projection groups may be placed at some cycles, with one cycle being five units (five rows) of the projection groups.

The vapor deposition apparatus of the following Embodiment 2 is also one preferred embodiment for solving the problem of generation of the non-film-formation regions.

Embodiment 2

Figure 18:
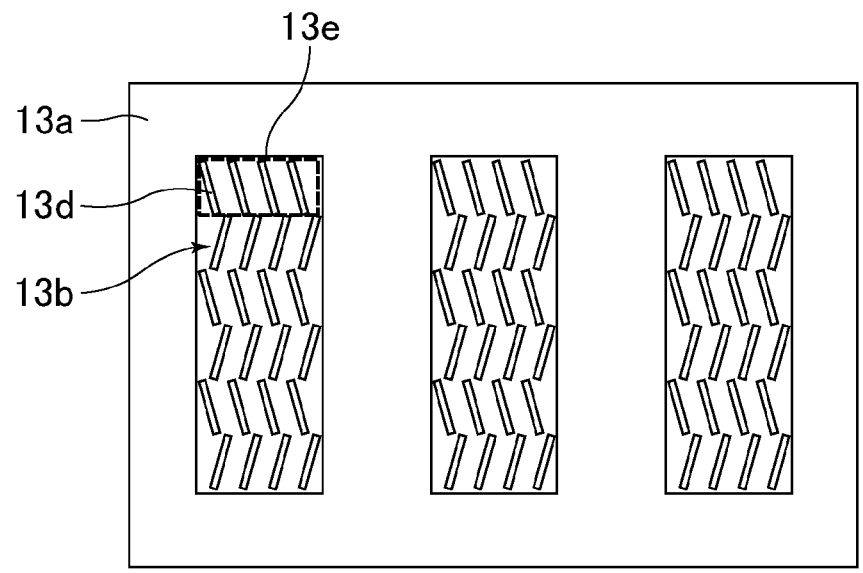
FIG. 18 is a conceptual view of the integrated limiting plate in a top view of a vapor deposition apparatus of Embodiment 2.

FIG. 18 is a conceptual view of the integrated limiting plate in a top view of a vapor deposition apparatus of Embodiment 2. As illustrated in FIG. 18, the small limiting plates 13b are directed to form an angle (specifically, to form an angle of 20° to 50°) with the longitudinal direction of the openings in the first limiting plate 13a. Also, the small limiting plates 13b are directed to form an angle with the scanning direction of the substrate and the longitudinal direction of the slits in the mask. The vapor deposition apparatus of Embodiment 2 is the same as the vapor deposition apparatus of Embodiment 1 except that the inclination of the small limiting plates in the top view is different.

As illustrated in FIG. 18, the small limiting plates in Embodiment 2 as a whole are arranged such that the projections extend in a direction at an angle with the longitudinal direction of the openings in the first limiting plate, and the projections are placed at certain intervals in a matrix both in the row and column directions. More specifically, sets of two rows of the projection groups 13e each consisting of the projections 13d arranged at certain intervals in the row direction are placed in lines, and the projection groups 13e are shifted from each other by half a cycle in the row direction between adjacent lines. In other words, the small limiting plates are formed by placing the projection groups 13e periodically in the column direction (in the example in the figure, three cycles of two rows). The cycle unit of the projection groups 13e and the number of the cycles are not limited in Embodiment 2, but it is preferred that one cycle unit consists of 2 rows as illustrated in FIG. 18 from the viewpoint of the efficiency.

The integrated limiting plate 13 illustrated in FIG. 18 enables formation of a uniform film when scanning vapor deposition is performed by scanning the substrate or the mask.

Figure 19:
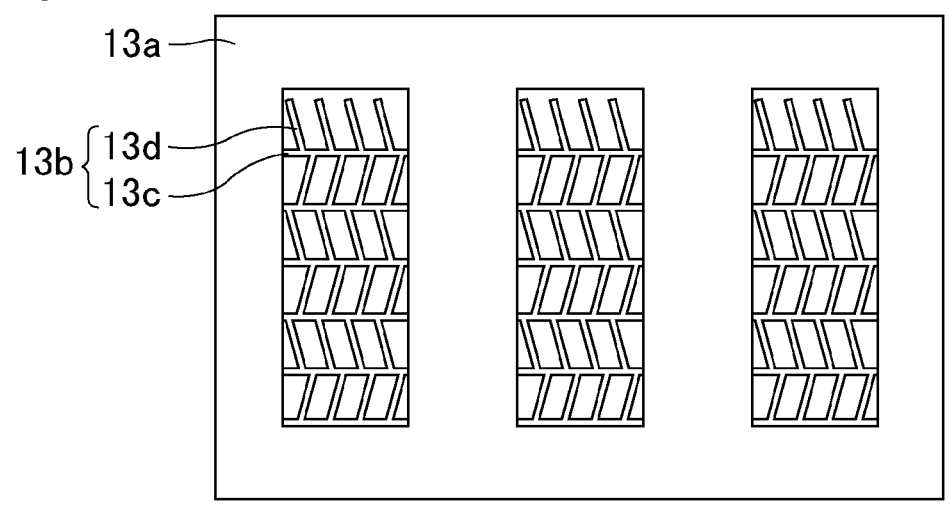
FIG. 19 is a schematic view illustrating one example of an integrated limiting plate in a top view of the vapor deposition apparatus of Embodiment 2.
Figure 20:
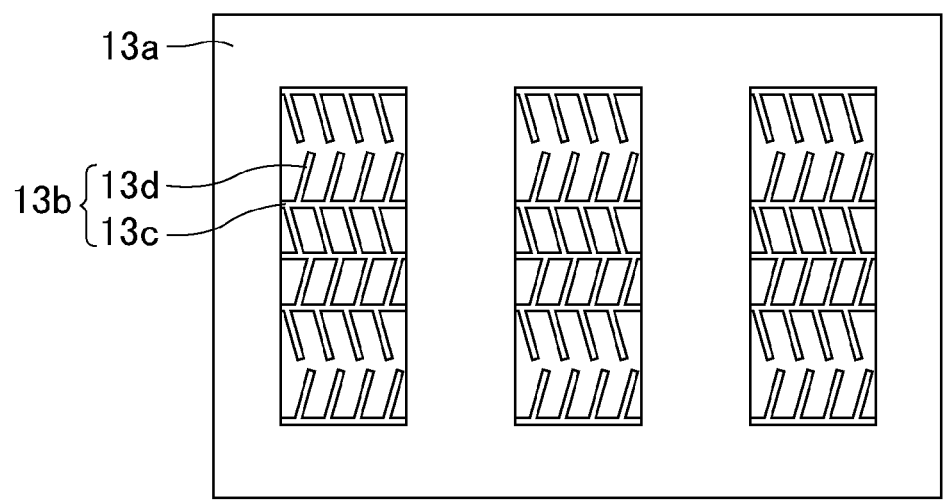
FIG. 20 is a schematic view illustrating another example of the integrated limiting plate in a top view of the vapor deposition apparatus of Embodiment 2.
Figure 21:
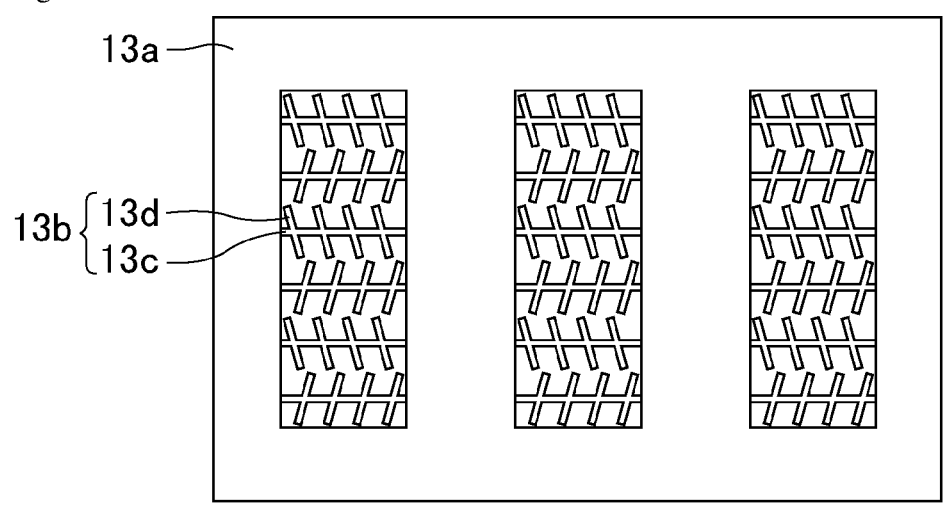
FIG. 21 is a schematic view illustrating yet another example of the integrated limiting plate in a top view of the vapor deposition apparatus of Embodiment 2.

The integrated limiting plate illustrated in FIG. 18 can specifically have any of the following structures. FIG. 19 to FIG. 21 each are a schematic view of an integrated limiting plate in a top view of the vapor deposition apparatus of Embodiment 2.

In the example illustrated in FIG. 19, the small limiting plates 13b as a whole resemble a shape of a bookshelf. Specifically, the small limiting plates 13b consist of the supporters 13c and the projections 13d alternately stacked from the bottom row to the top row.

In the example illustrated in FIG. 20, the small limiting plates 13b as a whole resemble a shape of a bookshelf. Specifically, the small limiting plates 13b consist of a ladder-like part positioned around the center of each opening in the first limiting plate 13a, the supporter 13c at the top row, the supporter 13c at the bottom row, and the projections 13d extending upwardly or downwardly from these parts.

In the example illustrated in FIG. 21, the small limiting plates 13b consist of units in each of which the projections 13d extend upwardly and downwardly from each side of each projection 13d.

The vapor deposition apparatus of the following Embodiment 3 is also a preferred embodiment of solving the problem of generation of the non-film-formation regions.

Embodiment 3

Figure 22:
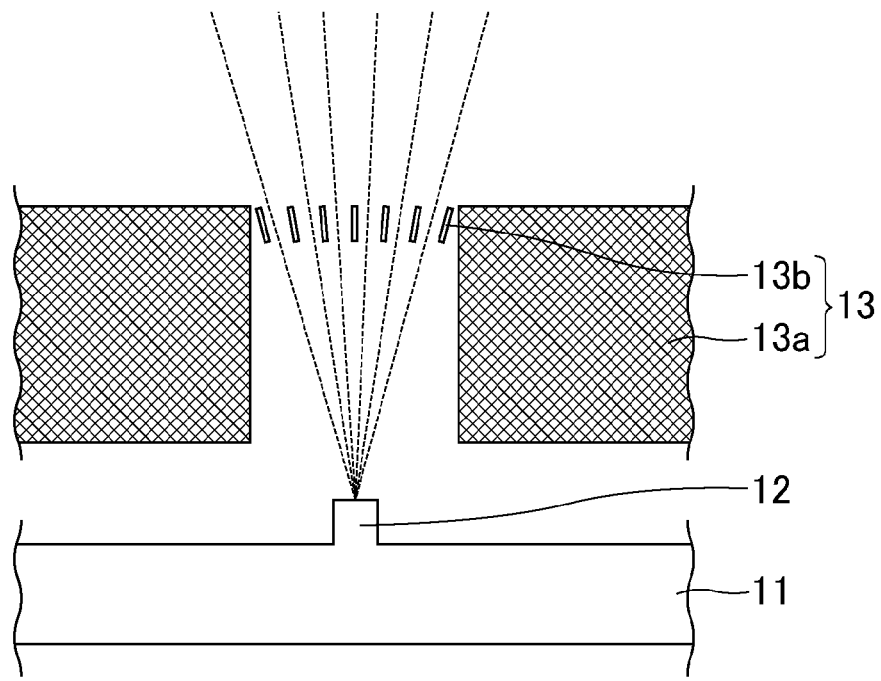
FIG. 22 is a schematic cross-sectional view of a vapor deposition apparatus of Embodiment 3.
Figure 23:
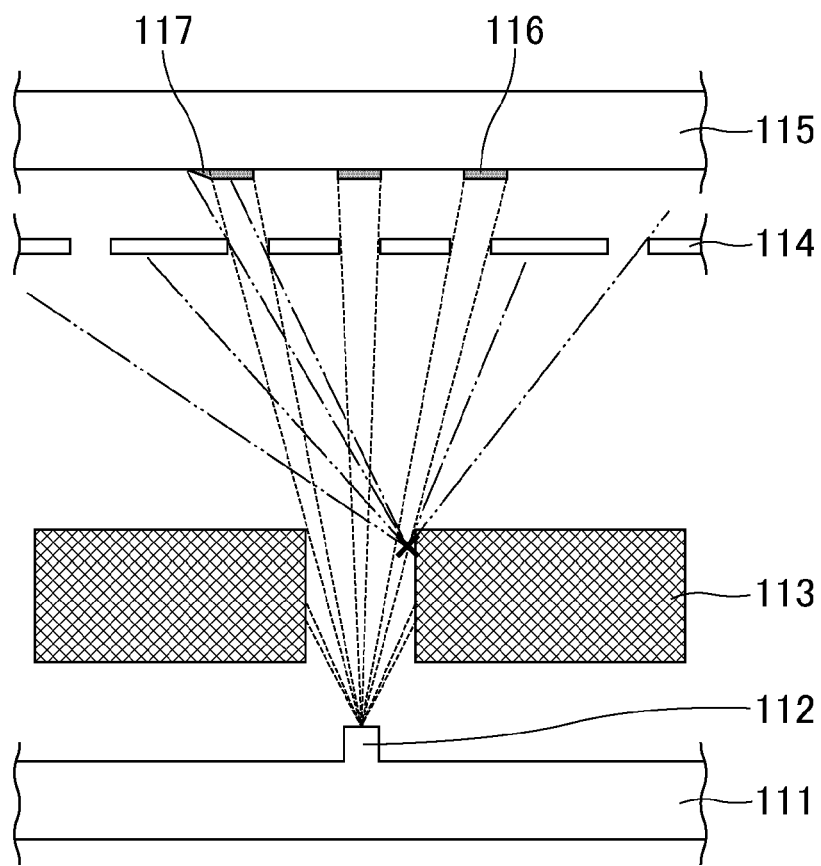
FIG. 23 is a schematic cross-sectional view illustrating a conventional vapor deposition apparatus that employs scanning vapor deposition.

FIG. 22 is a schematic cross-sectional view of a vapor deposition apparatus of Embodiment 3, and the dotted lines in FIG. 22 indicate the directions of the vapor deposition streams. The vapor deposition apparatus of Embodiment 3 is the same as the vapor deposition apparatus of Embodiment 1 except that the inclination of the small limiting plates is different in a view in the direction parallel to the upper surface or the lower surface of the first limiting plate, i.e., in a cross-sectional view of the vapor deposition apparatus.

Since vapor deposition streams as a whole are ejected from the ejection orifices of the nozzles 12 to spread isotropically, normal vapor deposition substances are not likely to be blocked when the angles of the directions of the small limiting plates 13b from the direction of the ejection orifice of the nozzle conform to the radiation angles of the vapor deposition stream (specifically, the small limiting plates 13b are arranged toward the ejection orifice of the nozzle). Hence, the example illustrated in FIG. 22 can reduce blocking of normal vapor deposition substances, thereby forming a uniform vapor deposition film.

REFERENCE SIGNS LIST 11, 111: Vapor deposition source
12, 112: Nozzle
13: Integrated limiting plate
13a: First limiting plate
13b: Small limiting plate (second limiting plate)
13c: Supporter
13d: Projection
13e: Projection group
14, 114: Mask (vapor deposition mask)
15, 115: Substrate (film-formation target substrate)
16, 116: Vapor deposition film
18: Electrostatic chuck
19: Alignment mark
113: Limiting plate
117: Microfilm

The invention claimed is:

1. A vapor deposition apparatus comprising:
a vapor deposition source equipped with a nozzle that ejects vapor deposition particles;
an integrated limiting plate equipped with a first limiting plate including an opening that is in front of the nozzle, and with second limiting plates placed in the opening in the first limiting plate; and
a mask including slits.

2. The vapor deposition apparatus of claim 1,
wherein in a view in the direction parallel to an upper surface or a lower surface of the first limiting plate, the second limiting plates are placed between the center of the opening in the first limiting plate and an outlet of the opening in the first limiting plate.

3. The vapor deposition apparatus of claim 2,
wherein in a view in the direction parallel to the upper surface or the lower surface of the first limiting plate, the second limiting plates are placed along an interface between the outlet of the opening in the first limiting plate and the outside.

4. The vapor deposition apparatus of claim 1,
wherein in a view in the direction perpendicular to an upper surface or a lower surface of the first limiting plate, the second limiting plates each are at an angle from the longitudinal direction of the opening in the first limiting plate.

5. The vapor deposition apparatus of claim 1,
wherein in a view in the direction parallel to an upper surface or a lower surface of the first limiting plate, the second limiting plates each are at an angle from the direction of an ejection orifice of the nozzle.

6. The vapor deposition apparatus of claim 1, further comprising:
a substrate holder configured to fix a film-formation target substrate; and
a scanning unit configured to fix the substrate holder and relatively move the vapor deposition source, the integrated limiting plate, and the mask.

7. The vapor deposition apparatus of claim 1, further comprising:
a substrate holder configured to fix a film-formation target substrate; and
a scanning unit configured to fix the vapor deposition source, the integrated limiting plate, and the mask, and move the substrate holder.

8. A method for producing an organic electroluminescent element, comprising
a vapor deposition step of forming a patterned thin film with a vapor deposition apparatus that includes a vapor deposition source equipped with a nozzle that ejects vapor deposition particles; an integrated limiting plate equipped with a first limiting plate including an opening that is in front of the nozzle, and with second limiting plates placed in the opening in the first limiting plate; and a mask including slits.

9. The method for producing an organic electroluminescent element of claim 8,
wherein the vapor deposition step is a step of forming a vapor deposition film on a film-formation target substrate while fixing a substrate holder holding the film-formation target substrate and relatively moving the vapor deposition source, the integrated limiting plate, and the mask.

10. The method for producing an organic electroluminescent element of claim 8,
wherein the vapor deposition step is a step of forming a vapor deposition film on a film-formation target substrate while fixing the vapor deposition source, the integrated limiting plate, and the mask and moving a substrate holder holding the film-formation target substrate.

* * * * *